US006735669B2

(12) United States Patent
Shin

(10) Patent No.: US 6,735,669 B2
(45) Date of Patent: May 11, 2004

(54) RAMBUS DRAM

(75) Inventor: Dong Woo Shin, Kyoungki-do (KR)

(73) Assignee: Hyundai Electronics Industries, Kyoungki-Do (KR)

( * ) Notice: Subject to any disclaimer, the term of this patent is extended or adjusted under 35 U.S.C. 154(b) by 78 days.

(21) Appl. No.: 09/751,395

(22) Filed: Jan. 2, 2001

(65) Prior Publication Data

US 2001/0029566 A1 Oct. 11, 2001

(30) Foreign Application Priority Data

Dec. 30, 1999 (KR) .......................... 1999-65706

(51) Int. Cl.⁷ .............................. G06F 12/00; G11C 8/00
(52) U.S. Cl. ........................ 711/106; 711/154; 365/222; 365/227
(58) Field of Search .............................. 711/106, 105, 711/154; 365/226, 227, 228, 229, 222

(56) References Cited

U.S. PATENT DOCUMENTS 6,263,448 B1 * 7/2001 Tsern et al. .................. 713/501
6,342,801 B1 * 1/2002 Shin ........................... 327/175
6,373,309 B1 * 4/2002 Bang .......................... 327/175

* cited by examiner

Primary Examiner—Kimberly McLean-Mayo
(74) Attorney, Agent, or Firm—Pillsbury Winthrop LLP

(57) ABSTRACT

This Rambus DRAM has a power save function which is not restricted in using time and has a short setting time, by forcibly compensating for a lost capacitor value in a memory cell to have a predetermined value, when a power save mode is changed to a normal mode. The Rambus DRAM includes: a memory core unit having a plurality of memory cells and a refresh counter; a packet controller for analyzing a packet control signal applied from an external channel, and generating a control signal for controlling a power mode; a power mode controller for generating each power mode signal and a self refresh enable signal for controlling the operation of the refresh counter according to the control signal; and a delay locked loop controlled according to the power mode signals, for adjusting a phase difference between a clock signal applied from the external channel and a clock signal used in a semiconductor memory device, generating to the power mode controller a signal notifying that the mode can be changed to a normal mode, and compensating for a current value lost in a capacitor of the memory cell.

6 Claims, 3 Drawing Sheets

RAMBUS DRAM

BACKGROUND OF THE INVENTION

1. Field of the Invention

The claimed inventions relate in general to Rambus DRAM arrangements. More specifically, the claimed inventions feature, at least in part, an improved Rambus DRAM arrangement having improved power save operation that is not restricted in using time and has a short setting time. It operates by forcibly compensating for loss of stored value of a capacitor of a memory cell when a power save mode is changed to a normal mode.

2. General Background and Related Art

In general, a Rambus DRAM has various operational modes for low power system operation, such as an active mode, a standby mode, a nap mode and a power down mode. The four modes can be organized based on a power reduction and a transmission time of the Rambus DRAM.

In the active mode, the Rambus DRAM is prepared to transmit data at any time. The Rambus DRAM consumes more power in the active mode than it does in any of the other modes.

In a general DRAM system all memory banks of each device perform a read/write operation according to an access command. In contrast, a Rambus DRAM system performs the read/write operation through one device, while the other devices are operated in a low power state.

The Rambus DRAM is automatically changed to standby mode in a last stage of its operation. When a device address is decoded by a request packet, all the Rambus DRAMs are changed to the standby mode, except for one device corresponding to the request. The device returns to the standby mode when finishing the read/write operation.

That is, the Rambus DRAM has a tendency to return to standby mode. Only the selected Rambus DRAM changes to active mode while the other Rambus DRAMs remain in the standby mode. As a result, power consumption is reduced.

In addition, power consumption can be reduced by changing the mode of operation of one or more Rambus DRAMs to nap mode. Nap mode operation consumes less power than standby mode operation, and is more rapidly changed to active mode than the power down mode. Whenever the system does not perform the read or write operation, the Rambus DRAM is changed to nap mode, thereby remarkably reducing power consumption. When one or more Rambus DRAMs are changed to the power down mode, power can also be considerably saved. For example, such a mode is applied to a portable computer.

FIG. 1 is a block diagram illustrating a conventional Rambus DRAM having a power save function. The Rambus DRAM includes a packet controller 20 for analyzing a packet ctrl_PKT applied from an external channel, and generating a control signal (op_code signal and cntrl signal) for controlling a power mode. A power mode controller 30 generates power mode signals (nap mode signal Nap and power down mode signal PDN) and a self refresh enable signal self_refresh_en according to the control signal (op_code signal and cntrl signal) from the packet controller 20. A delay locked loop 40 controlled according to the power mode signals, receives a clock signal clk_in from the external channel, detects a phase difference between the clock signal clk_in and a clock signal clk_out used in a semiconductor memory device, adjusts the two clock signals to have an identical phase, and generates to the power mode controller 30 a lock signal indicating that the mode can be changed to a normal mode. A memory core 10 has memory cells 14 and a refresh counter 12 controlled according to the self refresh enable signal self_refresh_en.

In the conventional Rambus DRAM, in the power save mode, a value stored in a capacitor of a memory cell is lost due to leakage current after an extended period of time. A setting time of a few hundred ns to a few $\mu$s is required to set up the value. In the nap mode using the data value stored in the capacitor of the memory cell, an exit time is about 100 ns and an allow time is just a few ns. However, power of 4 mA is consumed. In the power down mode, the allow time is not restricted and power of 1 mA is consumed, but the exit time reaches a few $\mu$s.

As a result, the conventional Rambus DRAM using the nap mode and the power down mode requires a long setting time to set up the capacitor value of the memory cell lost due to the leakage current in the power save mode, has the restricted using time, and increases power consumption.

SUMMARY

Some of the claimed inventions feature a Rambus DRAM having a power save function which is not restricted in using time and has a short setting time, by forcibly compensating for a lost capacitor value in a memory cell to have a predetermined value, when a power save mode is changed to a normal mode.

A Rambus DRAM constructed and arranged in accordance with the principles of the claimed inventions includes a memory core unit having a plurality of memory cells and a refresh counter. A packet controller analyzes a packet control signal applied from an external channel, and generates a control signal for controlling a power mode. A power mode controller generates each power mode signal and a self refresh enable signal for controlling the operation of the refresh counter according to the control signal. A delay locked loop (DLL) is controlled by the power mode signals and adjusts a phase difference between a clock signal applied from the external channel and a clock signal used in a semiconductor memory device, and provides to the power mode controller a signal indicating that the mode of operation can be changed to a normal mode.

The control signal includes an OP code signal for regulating operation modes and signals for controlling power modes. The OP code signal is preferably a two bits signal (but other bit arrangements are possible). According to the two bit signal arrangement, the mode cannot be changed to a power save mode when the two bits are '00', the mode is changed to a power down mode, when they are '01', the mode is changed to a nap mode when they are '01', and the mode is changed to a doze mode when the two bits are '11'.

The power mode signal includes a nap mode signal, a power down mode signal and a doze mode signal. The delay locked loop includes a phase detector and a mixer for receiving the clock signal from the external channel, detecting the phase difference between the clock signal applied from the external channel and the clock signal used in the semiconductor memory device, and mixing the clock signals. A clock amplification unit amplifies the output signal from the phase detector and mixer. A clock buffer unit buffers and outputs the output signal from the clock amplification unit. A control unit receives the power mode signal from the power mode controller, and controls the operation of each circuit. A bias generation unit provides bias signals respectively to the phase detector and mixer, the clock amplification unit and the clock buffer unit according to the power mode signal from the control unit. A duty cycle compensation unit controls the operation of the phase detector and mixer, the clock amplification unit and the clock buffer unit in order to compensate for the phase difference between the clock signal applied from the external channel and the clock signal used in the semiconductor memory device, and compensate for a current value lost in a cell capacitor of the memory core according to the power mode signal from the control unit.

Our Rambus DRAM arrangement includes a bias generation unit operable in normal mode, nap mode and doze mode, when the mode cannot be changed to the power save mode. The duty cycle compensation unit includes a capacitance compensation circuit for compensating for the current value lost in the cell capacitor of the memory core. The capacitance compensation circuit is operated in the power down mode and doze mode. The self refresh enable signal is enabled in the nap mode, doze mode and power down mode.

BRIEF DESCRIPTION OF THE DRAWINGS

Exemplary embodiments incorporating the principles of the claimed inventions will be described in detail with reference to the drawings. The exemplary embodiments are not the only arrangements suitable for practicing the claimed inventions, but rather are examples intended to convey a working knowledge of how to practice the claimed inventions.

DETAILED DESCRIPTION

Figure 1:
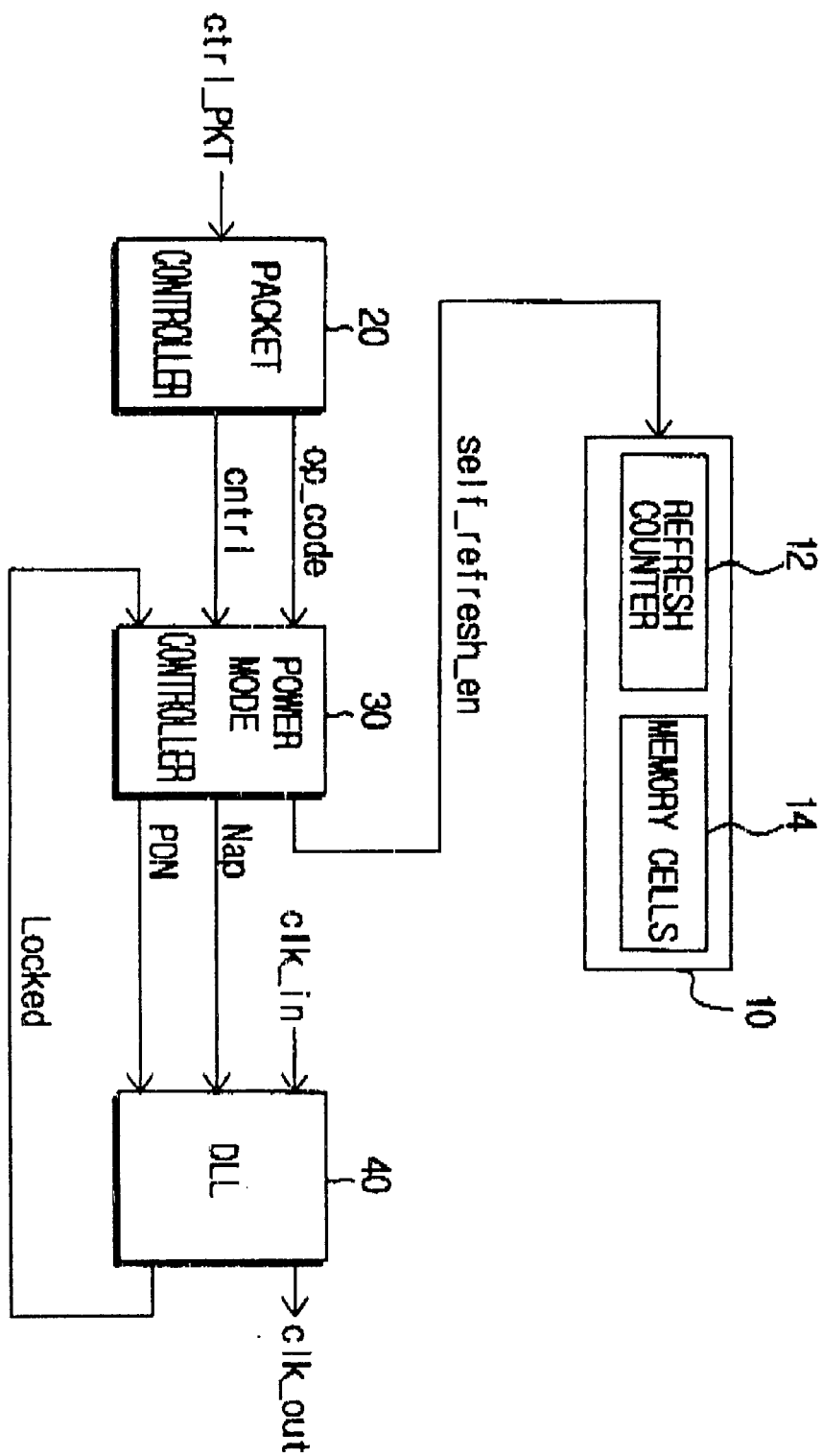
FIG. 1 (Prior Art) is a block diagram of a conventional Rambus DRAM having a power save function.

An exemplary embodiment of a Rambus DRAM arrangement according to the principles of the claimed inventions will now be described in detail with reference to the drawings. Elements having similar or identical function are provided with the same reference numeral, and repeated explanations thereof will be omitted.

Figure 2:
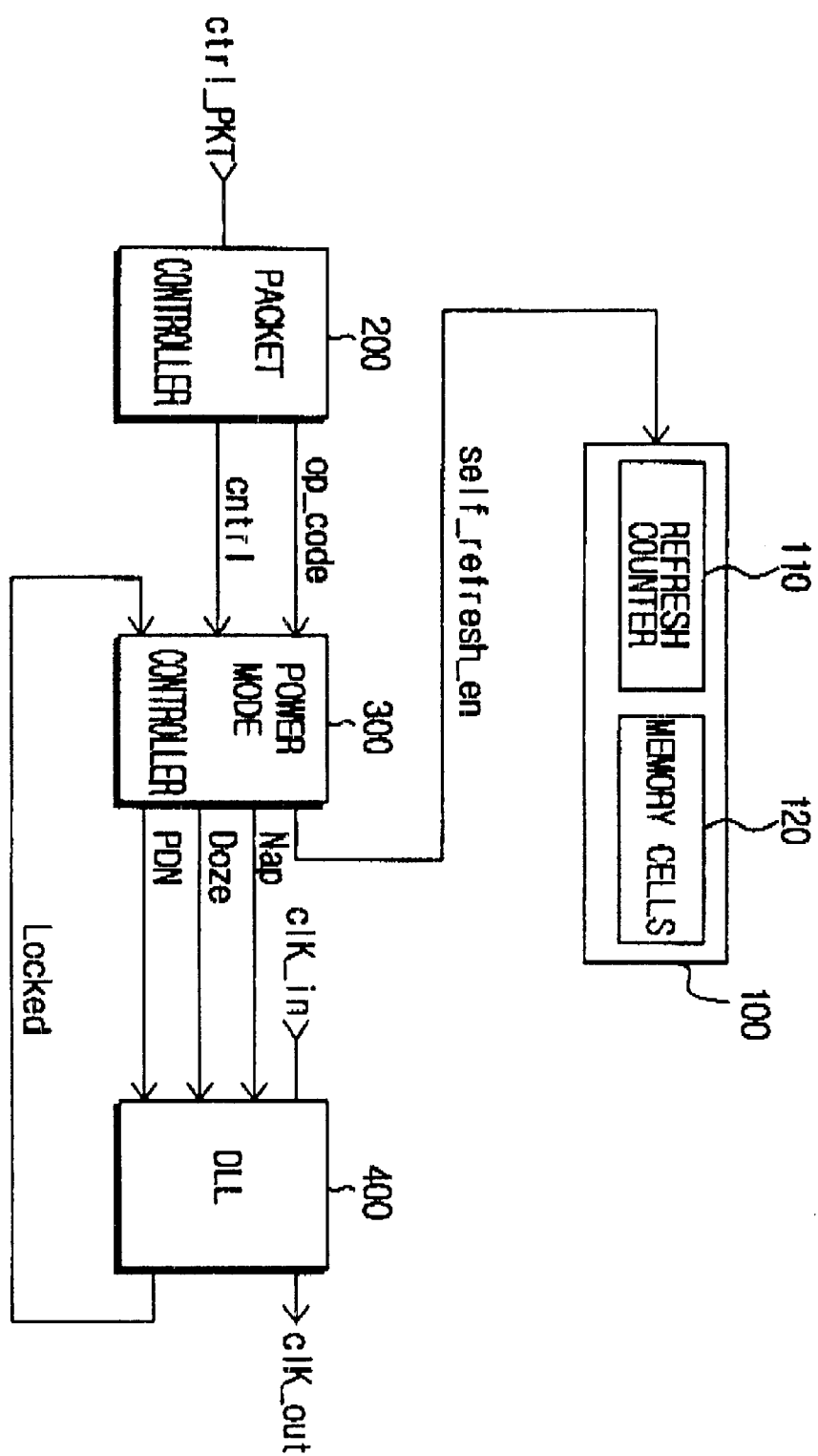
FIG. 2 is a block diagram of a Rambus DRAM having a power save function in accordance with the present inventions.

FIG. 2 is a block diagram of a Rambus DRAM arrangement having a power save function in accordance with the principles of the claimed inventions. The Rambus DRAM includes a packet controller 200 for analyzing a packet applied from an external channel, and generating a control signal (op_code signal and cntrl signal) for controlling a power mode. A power mode controller 300 receives the control signal (op_code signal and cntrl signal) from the packet controller 200, and generates power mode signals (nap mode signal Nap, power down mode signal PDN and doze mode signal Doze), and a self refresh enable signal self_refresh_en. A delay locked loop 400 controlled according to the power mode signals (nap mode signal Nap, power down mode signal PDN and doze mode signal Doze), receives a clock signal clk_in from the external channel, detects a phase difference between the clock signal clk_in applied from the external channel and a clock signal clk_out used in a semiconductor memory device, adjusts the two clock signals to have an identical phase, and generates to the power mode controller 300 a lock signal indicating that the mode can be changed to a normal mode. A memory core 100 has memory cells 120 and a refresh counter 110 controlled according to the self refresh enable signal self_refresh_en from the power mode controller 300.

The operation of the Rambus DRAM arrangement will now be described. The packet controller 200 receives the control packet ctrl_PKT from the external channel, generates the control signal cntrl and two bit OP code signal op_code required for the power mode controller 300, and inputs them to the power mode controller 300. Control signal cntrl controls power mode possibility, and the OP code signal op_code consisting of two bits regulates the respective power modes. For example, when the two bits are '00', the mode cannot be changed to the power save mode. When the two bits are '01', '10' and '11', the mode is changed to the power down mode, nap mode and doze mode, respectively.

Power mode controller 300 combines the two bit OP code signal op_code and the control signal cntrl from the packet controller 200, and generates the self refresh enable signal self_refresh_en, nap mode signal Nap, power down mode signal PDN and doze mode signal Doze in order to control the operation of the refresh counter (not shown) in the memory core 100. At this time, the mode operation according to the two bit OP code signal op_code and the control signal cntrl is as shown in Table 1.

TABLE 1

| Control cntrl | OP<1> code | OP<0> code | Mode |
| --- | --- | --- | --- |
| 0 | 0 | 0 | Normal mode |
| 1 | 0 | 1 | Power down mode |
| 1 | 1 | 0 | Nap mode |
| 1 | 1 | 1 | Doze mode |

The self refresh enable signal self_refresh_en generated in the power mode controller 300 is transmitted to the memory core 100 to operate the refresh counter inside or outside the memory core 100, thereby performing a self refresh operation. The nap mode signal Nap, doze mode signal Doze and power down mode signal PDN generated in the power mode controller 300 are transmitted to the delay locked loop 400, for respectively controlling the operation of the delay locked loop 500 according to their power states.

The delay locked loop 400 is controlled according to the nap mode signal Nap, power down mode signal PDN and doze mode signal Doze. It receives the clock signal clk_in from the external channel, detects the phase difference between the clock signal clk_in applied from the external channel and the clock signal clk_out used in the semiconductor memory device, adjusts the two clock signals to have an identical phase, and generates to the power mode controller 300 the locked signal indicating that the mode can be changed to the normal mode.

Figure 3:
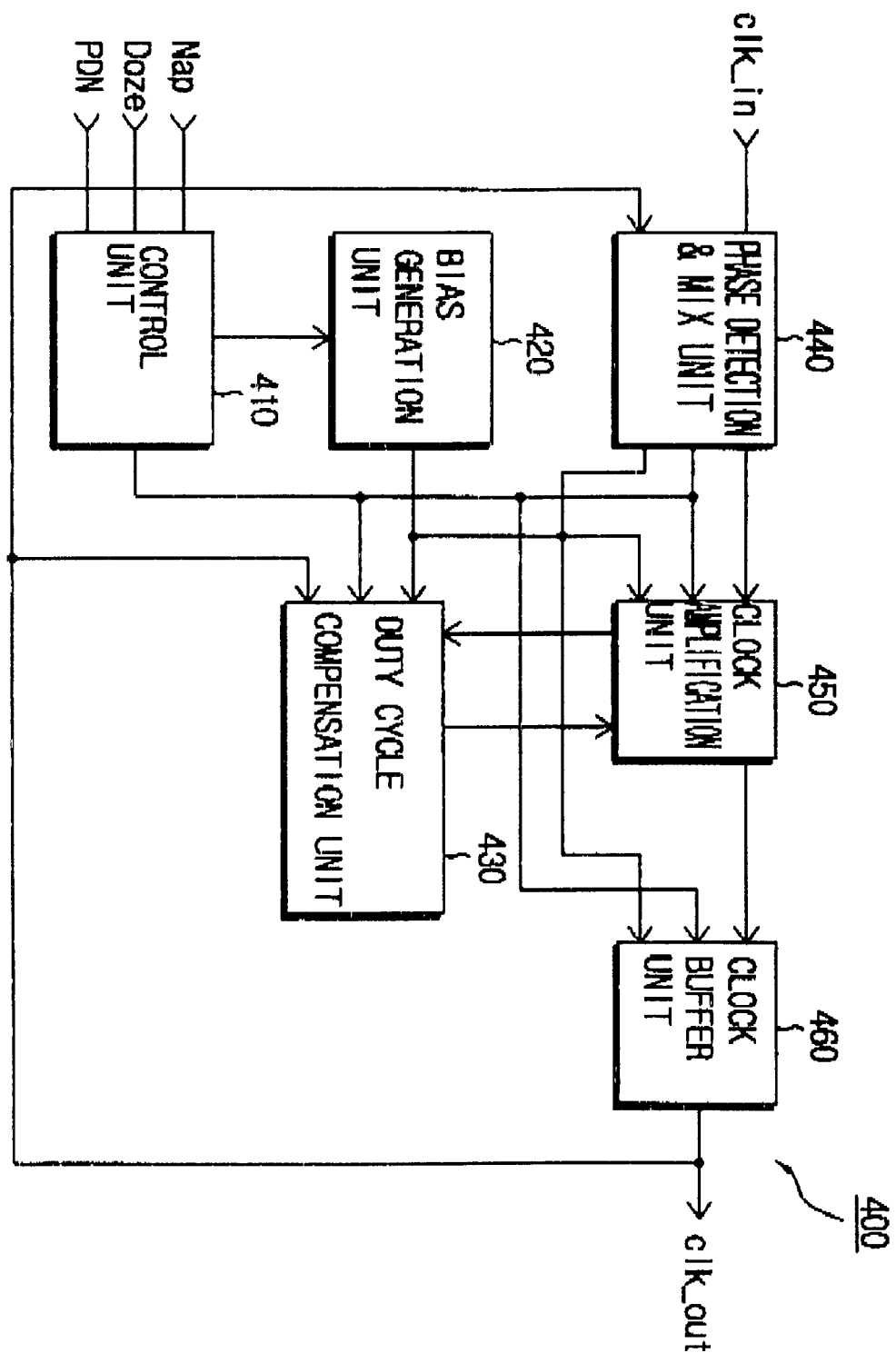
FIG. 3 is a block diagram showing the delay locked loop (DLL) of FIG. 2 in greater detail.

FIG. 3 is a detailed block diagram of delay locked loop 400, shown as a single block in FIG. 2. Delay locked loop 400 includes a control unit 410, a bias generation unit 420, a duty cycle compensation unit 430, a phase detection and mix unit 440, a clock amplification unit 450 and a clock buffer unit 460.

The phase detection and mix unit 440 receives the clock signal clk_in from the external channel, and outputs a signal obtained by detecting the phase difference between the clock signal clk_in applied from the external channel and the clock signal clk_out used in the semiconductor memory device and mixing the clock signals clk_in and clk_out. The clock amplification unit 450 amplifies the output signal from the phase detection and mix unit 440, and outputs the amplified signal to the clock buffer unit 460.

The duty cycle compensation unit 430 includes a capacitance compensation circuit (not shown), and supplies a current to the cell capacitor of the memory core 100 according to the power down mode signal PDN and the doze mode signal Doze, thereby compensating for the leakage current value. Duty cycle compensation unit 430 compensates for the phase difference between the clock signal clk__in and the clock signal clk__out.

The bias generation unit 420 is operated according to the nap mode signal Nap and doze mode signal Doze from the control unit 410, for generating a bias signal.

The control unit 410 controls the operation of the respective circuits according to the nap mode signal Nap, doze mode signal Doze and power down mode signal PDN from the power mode controller 300.

The operation of the delay locked loop 400 will now be explained. When the nap mode signal Nap is applied from the power mode controller 300, the capacitance compensation circuit of the duty cycle compensation unit 430 is not operated, but the bias generation unit 420 is operated. Conversely, when the power down mode signal PDN is applied, the bias generation unit 420 is not operated, but the capacitance compensation circuit of the duty cycle compensation unit 430 is operated. When the doze mode signal Doze is applied, the bias generation unit 420 and the capacitance compensation circuit of the duty cycle compensation unit 430 are all operated.

That is, the capacitance compensation circuit of the duty cycle compensation unit 430 is operated in the doze mode and the power down mode, and the bias generation unit 420 is operated in the nap mode and the doze mode.

When the power save mode is changed to the normal mode, for example when the nap mode is changed to the normal mode, a stored value is used as a capacitance value of the duty cycle compensation unit 430. When the doze mode and the power down mode are changed to the normal mode, the compensated capacitance value is employed. On the other hand, when the DLL lock operation is finished and thus the clock signal can be used, the lock signal is outputted to the power mode controller 300, thereby indicating that the normal mode operation can be performed.

As described above, the Rambus DRAM in accordance with the present invention can operate in doze mode which is almost identical in power consumption and exit time to the nap mode, but is not restricted in allow time, and thus efficiently performs the power save operation.

As discussed earlier, the Rambus DRAM has the power save function which is not restricted in using time and has a short setting time, by forcibly compensating for the lost capacitor value to have a predetermined value, when the power save mode is changed to the normal mode.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A Rambus DRAM arrangement, comprising:
   a memory core having a plurality of memory cells and a refresh counter;
   a packet controller for analyzing a packet control signal applied from an external channel, and generating a control signal for controlling a power mode;
   a power mode controller for generating power mode signals and a self refresh enable signal for controlling the operation of the refresh counter according to the control signal; and
   a delay locked loop (DLL) controlled according to the power mode signals, for adjusting a phase difference between a clock signal applied from the external channel and a clock signal used in a semiconductor memory device, generating to the power mode controller a signal notifying that the mode can be changed to a normal mode, and compensating for a current value lost in a capacitor of the memory cell;
   wherein the control signal comprises an OP code signal for regulating an operation modes and signals for controlling power modes; and
   wherein the OP code signal has two bits wherein the mode cannot be changed to a power save mode when the two bits are '00', the mode is changed to a power down mode, when they are '01', the mode is changed to a nap mode when they are '10', and the mode is changed to a doze mode when the two bits are '11'.

2. A Rambus DRAM arrangement, comprising:
   a memory core having a plurality of memory cells and a refresh counter;
   a packet controller for analyzing a packet control signal applied from an external channel, and generating a control signal for controlling a power mode;
   a power mode controller for generating power mode signals and a self refresh enable signal for controlling the operation of the refresh counter according to the control signal; and
   a delay locked loop (DLL) controlled according to the power mode signals, for adjusting a phase difference between a clock signal applied from the external channel and a clock signal used in a semiconductor memory device, generating to the power mode controller a signal notifying that the mode can be changed to a normal mode, and compensating for a current value lost in a capacitor of the memory cell;
   wherein the power mode signal comprises a nap mode signal, a power down mode signal and a doze mode signal.

3. A Rambus DRAM arrangement, comprising:
   a memory core having a plurality of memory cells and a refresh counter;
   a packet controller for analyzing a packet control signal applied from an external channel, and generating a control signal for controlling a power mode;
   a power mode controller for generating power mode signals and a self refresh enable signal for controlling the operation of the refresh counter according to the control signal; and
   a delay locked loop (DLL) controlled according to the power mode signals, for adjusting a phase difference between a clock signal applied from the external channel and a clock signal used in a semiconductor memory device, generating to the power mode controller a signal notifying that the mode can be changed to a normal mode, and compensating for a current value lost in a capacitor of the memory cell;
   wherein the DLL comprises:
      a phase detection and mix unit for receiving the clock signal from the external channel, detecting the phase difference between the clock signal applied from the external channel and the clock signal used in the semiconductor memory device, and mixing the clock signals;

a clock amplification unit for amplifying the output signal from the phase detection and mix unit;

a clock buffer unit for buffering and outputting the output signal from the clock amplification unit;

a control unit for receiving the power mode signal from the power mode controller, and controlling the operation of each circuit;

a bias generation unit for respectively generating a bias signal to the phase detection and mix unit, the clock amplification unit and the clock buffer unit according to the power mode signal from the control unit; and a duty cycle compensation unit for controlling the operation of the phase detection and mix unit, the clock amplification unit and the clock buffer unit in order to compensate for the phase difference between the clock signal applied from the external channel and the clock signal used in the semiconductor memory device, and compensating for a current value lost in the cell capacitor of the memory core according to the power mode signal from the control unit;

wherein the bias generation unit is operated in the normal mode, nap mode and doze mode, and when the mode cannot be changed to the power save mode.

4. An arrangement according to claim 3, wherein the duty cycle compensation unit comprises a capacitance compensation circuit for compensating for the current value lost in the cell capacitor of the memory, core.

5. An arrangement according to claim 4, wherein the capacitance compensation circuit is operated in a power down mode and a doze mode.

6. An arrangement according to claim 1, wherein the self refresh enable signal is enabled in a nap mode, a doze mode and a power down mode.

* * * * *